United States Patent
Wang et al.

(10) Patent No.: US 11,199,970 B2
(45) Date of Patent: Dec. 14, 2021

(54) DATA STORAGE DEVICE AND METHOD FOR REWRITING PARAMETERS THEREOF

(71) Applicant: Silicon Motion, Inc., Jhubei (TW)

(72) Inventors: Te-Kai Wang, New Taipei (TW); Yu-Da Chen, Taipei (TW)

(73) Assignee: SILICON MOTION, INC., Jhubei (TW)

( * ) Notice: Subject to any disclaimer, the term of this patent is extended or adjusted under 35 U.S.C. 154(b) by 0 days.

(21) Appl. No.: 16/929,326

(22) Filed: Jul. 15, 2020

(65) Prior Publication Data

US 2020/0348850 A1  Nov. 5, 2020

Related U.S. Application Data

(63) Continuation of application No. 16/432,015, filed on Jun. 5, 2019, now Pat. No. 10,754,548, which is a
(Continued)

(30) Foreign Application Priority Data

Jan. 16, 2018  (TW) ................................. 107101540

(51) Int. Cl.
*G06F 12/00* (2006.01)
*G06F 3/06* (2006.01)
(Continued)

(52) U.S. Cl.
CPC .......... *G06F 3/0605* (2013.01); *G06F 3/0619* (2013.01); *G06F 3/0634* (2013.01);
(Continued)

(58) Field of Classification Search
CPC .... G06F 3/0605; G06F 3/0619; G06F 3/0634; G06F 3/0679; G06F 12/0246;
(Continued)

(56) References Cited

U.S. PATENT DOCUMENTS 5,818,771 A    10/1998  Yasu et al.
6,292,012 B1   9/2001   Yeh et al.
(Continued)

FOREIGN PATENT DOCUMENTS

CN    104951402 A    9/2015
TW    I365675        8/1999
(Continued)

*Primary Examiner* — Shawn X Gu
(74) *Attorney, Agent, or Firm* — McClure, Qualey & Rodack, LLP

(57) ABSTRACT

A data storage device is provided. The data storage device includes a flash memory and a controller. The flash memory stores a firmware that includes a plurality of mode page settings, and each mode page setting includes a plurality of mode parameters. The controller receives a data out message arranged to rewrite a first mode page setting among the plurality of mode page settings from a host. The controller determines whether the data out message will change the mode parameters which cannot be rewritten in the first mode page setting by performing bitwise logic operations on a new mode page setting in the data out message, preset values of the plurality of mode parameters of the first mode page setting, and a rewriteable setting for each bit of the first mode page setting.

18 Claims, 5 Drawing Sheets

Related U.S. Application Data continuation of application No. 15/886,012, filed on Feb. 1, 2018, now Pat. No. 10,353,584.

(60) Provisional application No. 62/453,567, filed on Feb. 2, 2017.

(51) Int. Cl.
  *G11C 16/26* (2006.01)
  *G11C 16/22* (2006.01)
  *G11C 16/10* (2006.01)
  *G06F 12/02* (2006.01)

(52) U.S. Cl.
  CPC ........ *G06F 3/0679* (2013.01); *G06F 12/0246* (2013.01); *G11C 16/10* (2013.01); *G11C 16/22* (2013.01); *G11C 16/26* (2013.01); *G06F 2212/72* (2013.01); *G06F 2212/7206* (2013.01); *G06F 2212/7207* (2013.01); *G06F 2212/7209* (2013.01)

(58) Field of Classification Search
  CPC ......... G06F 2212/72; G06F 2212/7206; G06F 2212/7207; G06F 2212/7209; G11C 16/10; G11C 16/22; G11C 16/26
  See application file for complete search history.

(56) References Cited

U.S. PATENT DOCUMENTS

| | | | |
|---|---|---|---|
| 9,847,134 B2* | 12/2017 | Pao | .............. G11C 16/225 |
| 2007/0094469 A1 | 4/2007 | Haustein et al. | |
| 2015/0278087 A1 | 10/2015 | Han et al. | |
| 2016/0225439 A1 | 8/2016 | Kim | |
| 2016/0231950 A1 | 8/2016 | Kim et al. | |
| 2016/0378582 A1 | 12/2016 | Choi et al. | |

FOREIGN PATENT DOCUMENTS

| | | |
|---|---|---|
| TW | 446949 B | 7/2001 |
| TW | 200739345 A | 10/2007 |

\* cited by examiner

| bit / byte | 7 | 6 | 5 | 4 | 3 | 2 | 1 | 0 |
|---|---|---|---|---|---|---|---|---|
| 0 | A0 | B0 | C0 | C1 | C2 | C3 | C4 | C5 |
| 1 | D0 | D1 | D2 | D3 | D4 | D5 | D6 | D7 |
| 2 | E0 | E1 | E2 | E3 | F0 | G0 | G1 | H0 |

FIG. 2

DATA STORAGE DEVICE AND METHOD FOR REWRITING PARAMETERS THEREOF

CROSS REFERENCE TO RELATED APPLICATIONS

This application is a Continuation of U.S. application Ser. No. 16/432,015, filed Jun. 5, 2019 and entitled "DATA STORAGE DEVICE AND METHOD FOR REWRITING PARAMETERS THEREOF", which is a Continuation of application Ser. No. 15/886,012, filed Feb. 1, 2018 (now U.S. Pat. No. 10,353,584 issued on Jul. 16, 2019) which claims the benefit of U.S. Provisional Application No. 62/453,567, filed on Feb. 2, 2017, and claims priority of Taiwan Patent Application No. 107101540, filed on Jan. 16, 2018, the entirety of which are incorporated by reference herein.

BACKGROUND OF THE INVENTION

Field of the Invention

The present invention relates to a method for rewriting parameters, and in particular, to a method for rewriting parameters that avoids non-rewritable parameters being changed.

Description of the Related Art

A flash memory is a common non-volatile data storage device, which can be electrically erased and programmed. A non-gate type flash memory (i.e., NAND FLASH), for example, is commonly used as a memory card, a universal serial bus (USB) flash device, a solid state drive (SSD), an embedded flash Memory module (eMMC), and so on.

In the operation of a flash memory, a controller accesses and maintains the flash memory according to a number of parameters. In general, the operation parameters have default values, so that the flash memory can operate in the appropriate environment. The user can rewrite the operation parameters with specific commands. However, improper rewriting by the user may result in the flash memory operating in an inappropriate environment, such as long writing cycles or eliminating too much memory space. Therefore, a method is needed to avoid having the user change parameters that cannot be rewritten, thereby preventing the flash memory from operating improperly.

BRIEF SUMMARY OF THE INVENTION

The present invention provides a data storage device and a method for rewriting parameters which can reject a request for a non-rewritable mode parameter to be changed and notify the host of it.

An exemplary embodiment of a data storage device is provided. The data storage device comprises a flash memory and a controller. The flash memory stores a firmware. The firmware comprises a plurality of mode page settings, and each mode page setting comprises a plurality of mode parameters. The controller receives a mode selection command and a data out message from a host, wherein the data out message is arranged to rewrite a first mode page setting among the plurality of mode page settings. The controller determines whether the data out message will change the mode parameters which cannot be rewritten in the first mode page setting by performing bitwise logic operations on a new mode page setting in the data out message, preset values of the plurality of mode parameters of the first mode page setting, and a rewriteable setting for each bit of the first mode page setting. In response to any one of bits of a result of the bitwise logic operations being a non-zero value, the controller determines that the data out message will change the mode parameters which cannot be rewritten in the first mode page setting.

Moreover, in response to the controller deterimining that the data out message will not change the mode parameters which cannot be rewritten in the first mode page setting, the controller replies to the host with the UPIU (UFS Protocol Information Units) response message indicating a success event. In response to the controller deterimining that the data out message will change the mode parameters which cannot be rewritten in the first mode page setting, the controller replies to the host with an UPIU response message indicating a failure event.

In an embodiment, the controller receives the mode selection command from the host. After the controller sends a ready-to-transfer message to the host in response to the mode selection command, the controller receives the data out message which is sent by the host in response to the ready-to-transfer message. The mode selection command comprises a save page parameter which is used to indicate whether the plurality of new mode parameters are kept after the data storage device is turned off. The controller determines that the plurality of new mode parameters are not kept in the flash memory after the data storage device is turned off when the save page parameter is "0", and determines that the plurality of new mode parameters are kept in the flash memory after the data storage device is turned off when the save page parameter is "1".

In another embodiment, the controller fills the plurality of new mode parameters into a first array, fills preset values of the plurality of mode parameters of the first mode page setting into a second array, performs a bitwise XOR logic operation on the first array and the second array to obtain a first result. The controller fills the first result into a third array. The controller performs a bitwise AND logic operation on the third array and a fourth array and fills a result of the AND logic operation into a fifth array. In the fourth array, bits corresponding to the mode parameters which cannot be rewritten are "1", and bits corresponding to the mode parameters which can be rewritten are "0". When any one of bits in the fifth array is a non-zero integer, the controller determines that the data out message will change the mode parameters which cannot be rewritten in the first mode page setting.

An exemplary embodiment of a method for rewriting parameters is provided. The method for rewriting parameters is applied in a data storage device which comprises a flash memory storing a firmware. The firmware comprises a plurality of mode page settings. Each mode page setting comprises a plurality of mode parameters. The method for rewriting parameters comprises steps of receiving a mode selection command and a data out message from a host, wherein the data out message is arranged to rewrite a first mode page setting among the plurality of mode page settings; determining whether the data out message will change the mode parameters which cannot be rewritten in the first mode page setting by performing bitwise logic operations on a new mode page setting in the data out message, preset values of the plurality of mode parameters of the first mode page setting, and a rewriteable setting for each bit of the first mode page setting; and in response to any one of bits of a result of the bitwise logic operations being a non-zero value, the controller determines that the data out message will change the mode parameters which cannot be rewritten in the first mode page setting.

Moreover, the method for rewriting parameters further comprises a step of when the data out message will not change the mode parameters which cannot be rewritten in the first mode page setting, replying to the host with the UPIU response message indicating a success event, and a step of when the data out message will change the mode parameters which cannot be rewritten in the first mode page setting, replying to the host with an UPIU response message indicating a failure event.

In an embodiment, the method for rewriting parameters further comprises steps of sending a ready-to-transfer message to the host in response to the mode selection command. The data out message is sent by the host in response to the ready-to-transfer message. The mode selection command comprises a save page parameter which is used to indicate whether the plurality of new mode parameters are kept after the data storage device is turned off. The method for rewriting parameters further comprises steps of determining that the plurality of new mode parameters are not kept in the flash memory after the data storage device is turned off when the save page parameter is "0", and determining that the plurality of new mode parameters are kept in the flash memory after the data storage device is turned off when the save page parameter is "1".

Moreover, the step of determining whether the data out message will change the mode parameters which cannot be rewritten in the first mode page setting according to the data out message comprises steps of filling the plurality of new mode parameters into a first array; filling preset values of the plurality of mode parameters of the first mode page setting into a second array; performing a bitwise XOR logic operation on the first array and the second array to obtain a first result; and filling the first result into a third array.

In an embodiment, the step of performing the bitwise logic operations comprises steps of: performing a bitwise AND logic operation on the third array and a fourth array; filling a result of the AND logic operation into a fifth array, wherein in the fourth array, bits corresponding to the mode parameters which cannot be rewritten are "1", and bits corresponding to the mode parameters which can be rewritten are "0"; when any one of bits in the fifth array is a non-zero integer, determining that the data out message will change the mode parameters which cannot be rewritten in the first mode page setting; and when none of the bits in the fifth array is a non-zero integer, determining that the data out message will not change the mode parameters which cannot be rewritten in the first mode page setting.

Moreover, the data storage device conforms to a specification of universal flash storage (UFS). The plurality of mode page settings comprise a control mode page setting, a read-write error mode page setting, and a caching mode page setting.

In an embodiment, the UPIU response message comprises a response field, a status field, a sense data [2] field, and a sense data [12]-[13] field. In the UPIU response message corresponding to the failure event, the response field is set as "TARGET FAILURE", the status field is set as "CHECK CONDITION", the sense data [2] field is set as "ILLEGAL REQUEST", and the sense data [12]-[13] field is set as "INVALID FIELD IN PARAMETER LIST". In the UPIU response message corresponding to the success event, the response field is set as "TARGET SUCCESS", the status field is set as "GOOD". The data out message comprises a header and a new mode page setting. The new mode page setting corresponds to the first mode page setting and comprises a plurality of new mode parameters corresponding to the plurality of mode parameters of the first mode page setting.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 2 is a schematic diagram showing a data structure of a mode page setting according to an exemplary embodiment;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
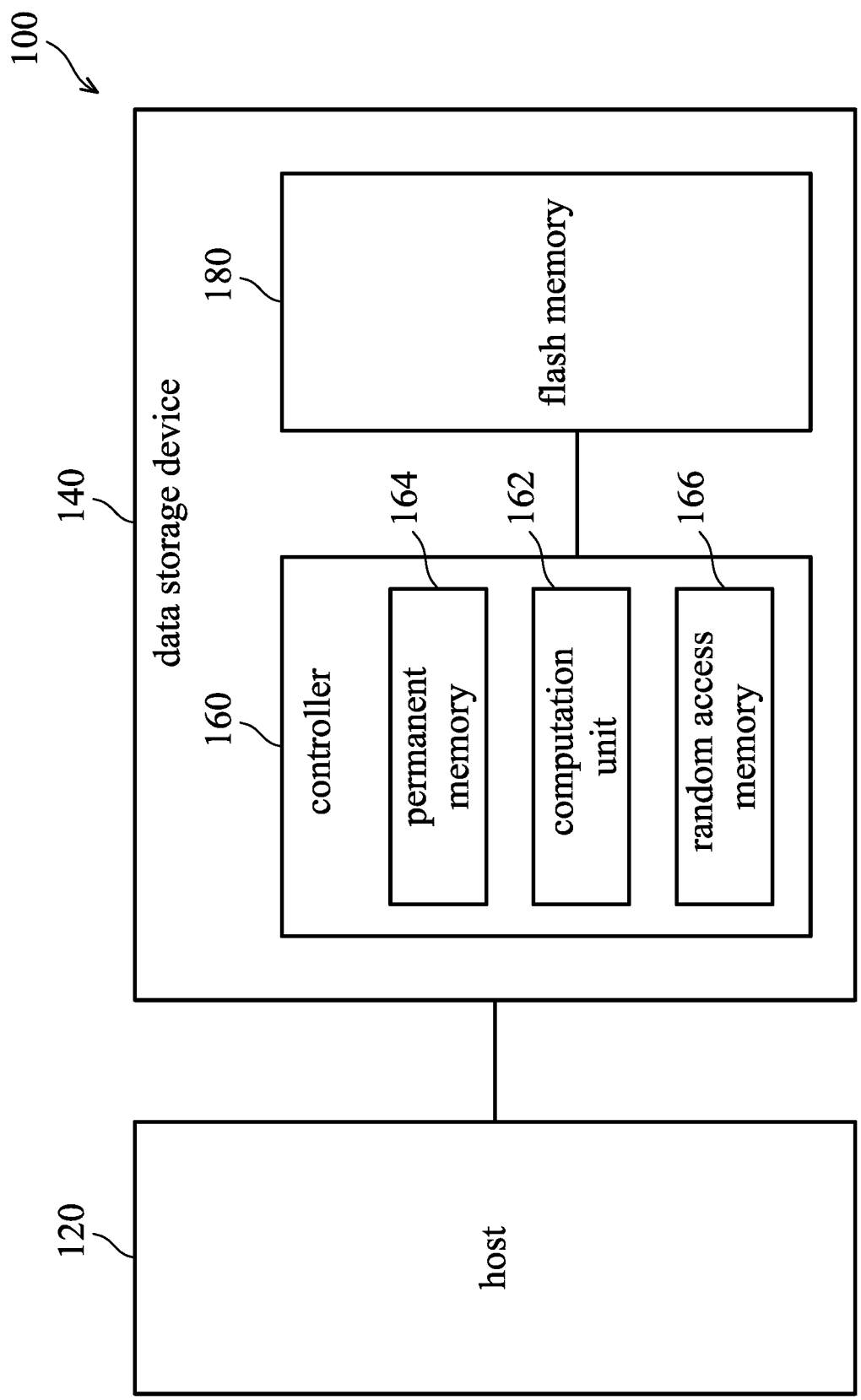
FIG. 1 is a block diagram of an exemplary embodiment of an electronic system.

FIG. 1 is a block diagram of an exemplary embodiment of an electronic system. An electronic system 100 comprises a host 120 and a data storage device 140. The data storage device 140 comprises a flash memory 180 and a controller 160 and operates in response to commands received from the host 120. It should be noted that, in an embodiment, the data storage device 140 conforms to the specification of universal flash storage (UFS). In addition, the electronic system 100 may be implemented on another computer-system configuration, such as a mobile device, a multi-processor system, a microprocessor-based or programmable consumer electronic, a network computer, a minicomputer, a mainframe computer, and the like. For example, the electronic system 100 may be implemented in a mobile device, such as a mobile phone, a tablet, a smart watch, and a virtual reality device. The host 120 may be a central processing unit (CPU) or a microprocessor (MCU), and the data storage device 140 may be a memory device in the mobile device.

The controller 160 is configured to control the flash memory 180 based on the firmware stored in the flash memory 180. The controller 160 comprises a computation unit 162, a permanent memory 164 (ROM), and a random access memory 166 (RAM). The permanent memory 164 and the program codes loaded in the permanent memory 164 form a bootloader which is executed by the computation unit 162 to boot the data storage device 140. The random access memory 166 is used for temporarily storing the data and firmware which will be provided to and executed by the computation unit 162. The flash memory 180 comprises a plurality of blocks, and each block comprises a plurality of pages for storing the firmware of the data storage device 140 or data.

In an embodiment, the firmware comprises a plurality of mode page settings (i.e., SCSI mode settings). The mode page setting may comprise a control mode page setting, a read-write error mode page setting, and a caching mode page setting. Each of the mode page settings comprises a plurality of mode parameters. The controller 160 may operate based on the mode parameters in each mode page setting. In an embodiment, the control mode page setting can be used to provide control parameters (such as task set management and error logging) under a small computer system interface for all devices; the read-write error mode page setting can be used to set an error recovery parameter that the data storage device 140 should use to read/write the flash memory 180 under any command (e.g., a read command, a write command, or a confirm command); the caching mode page settings can be used to define how to use the cached parameters.

In an embodiment, the mode parameters of the control mode page setting, the read-write error mode page setting, and the caching mode page setting are respectively preset as preset mode parameters. The host 120 may issue a mode select command to require the controller 160 to rewrite one of the mode page settings as a new mode page setting with new parameters different from the corresponding preset parameters. In an embodiment, the mode selection command may comprise a save page parameter (SP parameter) to indicate whether the new mode parameters of the new mode page setting are kept after the data storage device 140 is turned off. For example, when the SP parameter of the mode selection command is "0", the controller 160 may rewrite the corresponding preset mode parameters temporarily stored in the random access memory 166 as new mode parameters. When the SP parameter of the mode selection command is "1", the controller 160 may rewrite the corresponding preset mode parameters temporarily stored in the random access memory 166 as new mode parameters and simultaneously rewrite the corresponding preset parameters stored in the flash memory 180 as new mode parameters.

In an embodiment, most of the preset mode parameters in each mode page setting cannot be rewritten. If the host 120 instructs the controller 160 to rewrite the mode parameters which cannot be rewritten, the data storage device 140 cannot operate properly and normally. In an embodiment, except for the parameters of the software write protect (SWP), all of the other mode parameters in the control mode page setting are un-rewritable, wherein the parameter of software write protection indicates whether to refuse (terminate) the write command received from the host 120 is required. In other words, the parameter of software write protection indicates that it necessary for the controller 160 to prohibit the write operation performed on the flash memory 180 after the data is written into all the caches or buffer. For example, the architecture of the write command may comprise a format unit command, write (6), write (10), write (16), a synchronize cache command, a unmap command, and a verify command. If the parameter of the software write protection is set to "1", the controller 160 may refuse the write command. If the parameter of the software write protection is set to "0", the controller 160 may allow the write command to be executed. Therefore, when the parameter of the software write protection is "1", all the commands related to the write operation of the flash memory 180 are terminated, and the wrong information is returned, that is, an UFS protocol information units (UPIU) response message is sent to the host 120 after the termination. The UPIU response message (response UPIU) comprises a response field set as "TARGET FAILURE", a status field set as "CHECK CONDITION", a sense data[2] field (sense key) set as "DATA PROTECTION", and a sense data[12]-[13] field (ASC & ASCQ) set as "WRITE PROTECTED". The preset mode of the data storage device 140 may be a normal mode that allows the execution of the write command received from the host 120. When a new control mode page setting and its parameter of the software write protection is set to "1", the data storage device 140 may switch to a data protection mode that prohibits execution of a write command received from the host 120. When the data storage device 140 receives a write command in the data protection mode, the data storage device 140 may reply the foregoing UPIU response message to the host 120. Then, the data storage device 140 may continue to operate in the data protection mode until a new control mode page setting with a parameter of the software write protection set to "0" is received. The control mode page setting with the parameter of the software write protection set to "0" may cause the data storage device 140 to switch back to the normal operation mode. In the embodiment of the present invention, UPIU is an abbreviation of the UFS protocol information units for a flash memory.

In an embodiment, except for the parameters of the read retry count (RRC), the write retry count (WRC), and the recovery time limit (RTL), all of the other mode parameters in the read-write error mode page setting cannot be rewritten, wherein the parameter of the read retry count indicates how many times preparation controller 160 needs to perform the recovery algorithms in the reading process, the parameter of the write retry count indicates how many times the controller 160 needs to perform the recovery algorithm in the writing process, and the recovery time limit indicates how long (millisecond) the controller 160 can continuously perform the recovery process, but the present invention is not limited thereto. In an embodiment, the data storage device 140 may operate in a normal operation mode, a high read recovery mode, a high write recovery mode, and a high read-write recovery mode. In detail, the data storage device 140 may be preset to operate in a normal operation mode, wherein the parameters of the read retry count, the write retry count, and the recovery time limit may be preset as a first value, a second value, and a third value, respectively. For example, the preset parameters of the read retry count, the write retry count, and the recovery time limit may be "0", "0" and "0x4b0", respectively. When a new read-write error mode page setting with a parameter of the read retry count which is set as a fourth value is received, the data storage device 140 may be switched to the high read recovery mode, wherein the fourth value is a non-negative integer, and the fourth value is greater than the first value. In another embodiment, when a new read-write error mode page setting with a parameter of the write retry count which is set as a fifth value is received, the data storage device 140 may switch to the high write recovery mode, wherein the fifth value is a non-negative integer, and the fifth value is greater than the second value. In another embodiment, when a new read-write error mode page setting with a parameter of the read retry count which is set as the fourth value and a parameter of the write retry count which is set as the fifth value is received, the data storage device 140 may receive is switch to the high read-write recovery mode.

In an embodiment, except for the parameters of the write back cache enable (WCE) and the read cache disable (RCD) in the caching mode page setting, all of the other mode parameters cannot be rewritten. When the parameter of the write back cache enable "WCE" is set to "0", the data storage device 140 should complete the write command with a good status (i.e., replying a UPIU response message which comprises a response field set as "TARGET SUCCESS" and a status field set as "GOOD") after all data is correctly written into the flash memory 180. When the parameter of the write back cache enable "WCE" is set to "1", the data storage device 140 can the write command with a good status after the correct data is received and before the data is written into the flash memory 180. When the parameter of the read cache disable "RCD" is set to "0", the data storage device 140 may read the data required for the read command from the random access memory 166 or the flash memory 180 and transmit it to the host 120. When the parameter of the read cache disable "RCD" is set to "1", the data storage device 140 may read the data required for the read command only from the flash memory 180 and transmit it to the host 120 (i.e., when the data required for the read command is stored in the random access memory 166, the controller 160 needs to write the requested data to the flash memory 180 from the random access memory 166, and then the controller 160 can read the required data from the flash memory 180 and transmit it to the host 120). In an embodiment, the data storage device 140 has a normal operation mode, a write back cache disable mode, and a read cache enable mode. The data storage device 140 can be preset to operate in the normal operation mode, wherein in the preset caching mode page setting, the parameter of the read cache access disable "RCD" is preset to "0" and the write back cache enable "WCE" is preset to "1". When a new caching mode page setting with a parameter of the read cache disable "RCD" set to "1" is received, the data storage device 140 may be switched from the normal operation mode to the read cache enable mode. When a new caching mode page setting with a parameter of the write back cache enable "WCE" set to "0" is received, the data storage 140 may be switched from the normal operation mode to the write back cache disable mode.

FIG. 2 is a schematic diagram showing a data structure of the mode page setting according to an exemplary embodiment. FIG. 2 shows a table 200 for representing the bit data stored in the mode page setting. The data length of the mode page setting is 3 bytes. The first row in the table 200 shows that the data of the first byte in the mode page setting comprises the bits A0, B0, C0-C5, the second row shows that the data of the second byte following the first byte in the mode page setting comprises the bits D0-D7, and the third row shows that the third byte following the second byte in the mode page setting comprises the bits E0-E3, F0, G0-G1, and H0. In addition, each of the symbols A0, B0, C0-C5, D0-D7, E0-E3, F0, G0-G1, H0 is 1 bit (i.e., "0" or "1"). The bit A0 is a first mode parameter, the bit B0 is a second mode parameter, the bits C0-C5 form a third mode parameter, the bits D0-D7 form a fourth mode parameter, the bits E0-E3 form a fifth mode, the bit F0 is a sixth mode parameter, the bits G0-G1 form a seventh mode parameter, and the bit H0 is an eighth mode parameter. In other words, one mode parameter is composed of at least one bit, and the lengths of the mode parameters are not necessarily the same.

As mentioned above, the present invention further provides an embodiment which can prevents the host 120 from rewriting the mode parameters that cannot be rewritten. In one embodiment, when the controller 160 receives a mode selection command from the host 120, the controller 160 may send back a ready-to-transfer message (ready-to-transfer UPIU) to cause the host 120 to send a data out message (data out UPIU). The data out message comprises a header and a new mode page setting. In other words, the data out message comprises a message which indicates that the mode page setting needs to be rewritten and new mode parameters which need to be written into the mode page setting.

In an embodiment, after obtaining new mode parameters, the controller 160 needs to perform several determination processes. During the determination processes, the controller 160 needs to declare the variable of each preset mode parameter and compare each new mode parameter with the corresponding preset mode parameter to determine which parameters are changed and whether the changed parameters are the mode parameters which cannot be rewritten.

The above determination processes may take a considerable amount of operation time and resources of the controller 160. Therefore, the present invention further provides another embodiment for determining whether new mode parameters different from preset mode parameters cannot be rewritten through using a specific logic operation and an array. The detailed process will be described by referring to the illustration of FIG. 3.

Figure 3:
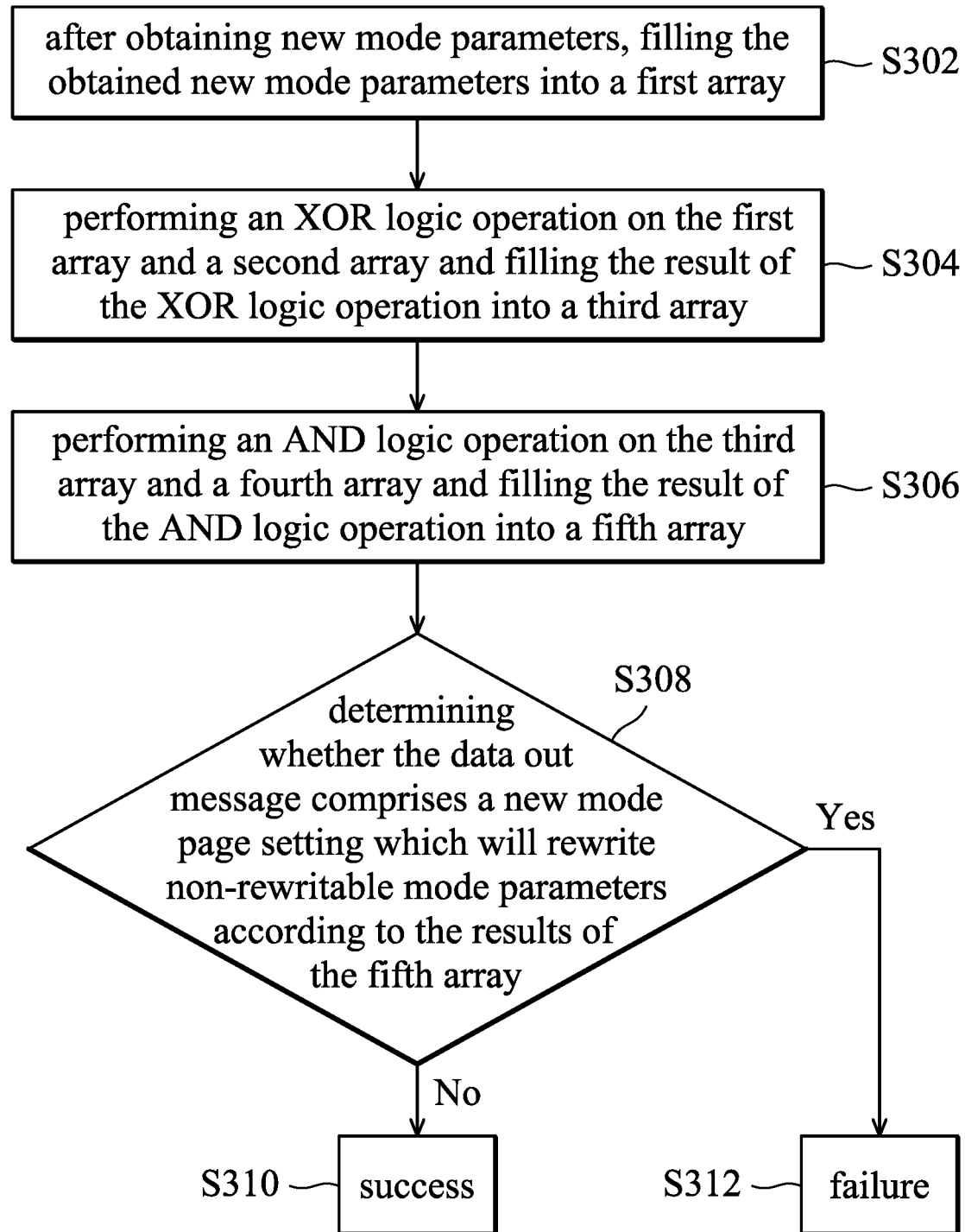
FIG. 3 is a flowchart of an exemplary embodiment of a method for rewriting parameters.
Figure 4:
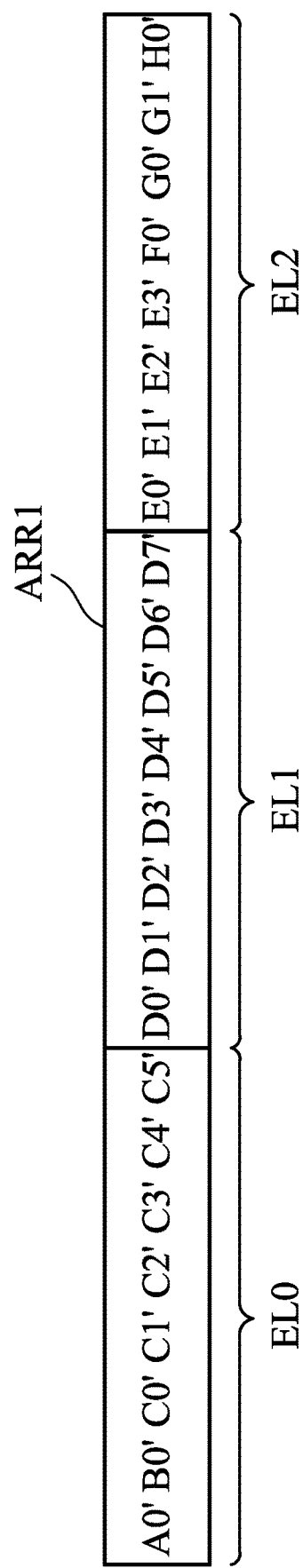
FIG. 4 is a schematic diagram showing a first array according to an exemplary embodiment.

FIG. 3 is a flowchart of an exemplary embodiment of a method for rewriting parameters. As shown in FIG. 3, in step S302, after obtaining new mode parameters, the controller 160 fills the obtained new mode parameters into a first array RR1. As shown in FIG. 4, the first array ARR1 comprises three elements EL0-EL2, the size of each element is 1 byte for storing the parameters corresponding to one of the rows of the mode page setting. In other words, the size of the first array ARR1 corresponds to the size of the new mode page setting. For example, the controller 160 may obtain eight new mode parameters which correspond to the mode parameters shown in FIG. 2, respectively. The obtained new parameters obtained comprise a new first mode parameter with a bit A0', a new second mode parameter with a but B0', a new third mode parameter with bits C0'-C5', a new fourth mode parameter with bits D0'-D7', a new fifth mode parameter with bits E0'-E3', a new sixth mode parameter with a bit F0', a new seventh mode parameter with bits G0'-G1', and a new eighth mode parameter with a bit H0'. Next, the controller 160 fills the eight bits A0', B0', and C0'-C5' corresponding to the first row of the table 200 into the first element EL0 of the first array ARR1, fills the eight bits D0'-D7' and E0' corresponding to the second row of the table 200 into the second element EL1 of the first array ARR1, and further fills the eight bits E1'-E3', F0', G0'-G1', and H0' corresponding to the third row of the table 200 into the third element EL2 of the first array ARR1. It is noted that the size of each element in the first array ARR1 corresponds to the length of the bits in each row of the mode page setting. In other words, the size of the elements of the first array ARR1 may be larger than one byte based on the size of each row of in the mode page setting. The number of elements in the array is not limited to the number of this embodiment. In addition, FIGS. 4 and 5 can be referred for the structure of other arrays disclosed in the present invention.

Figure 5:
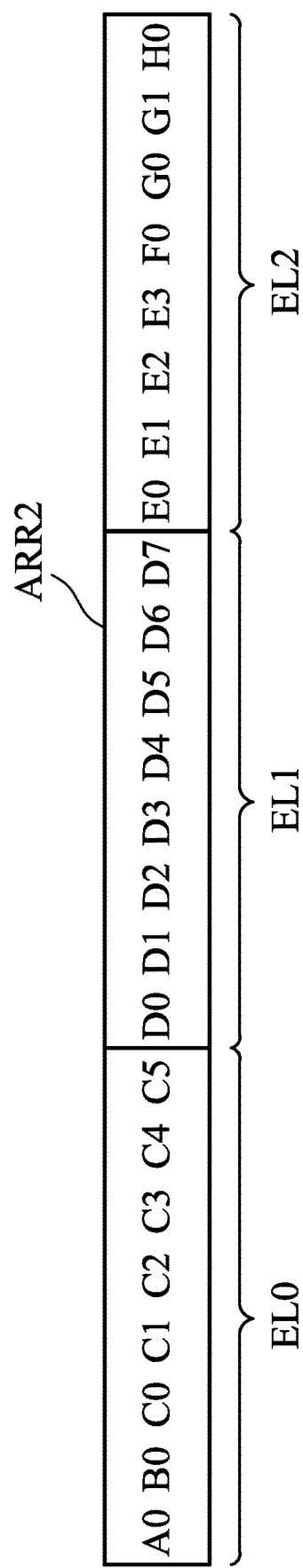
FIG. 5 is a schematic diagram showing a second array according to an exemplary embodiment.

Next, in step S304, the controller 160 performs an XOR logic operation (XOR operation) on the first array ARR1 and the second array ARR2 and fills the result of the XOR logic operation into a third array. The elements EL0-EL2 of the second array ARR2 (as shown in FIG. 5) are filled with preset mode parameters of the preset mode page setting (the preset values of the mode parameters of the preset mode page setting), and the third array may represent the difference between the first array and the second array. Moreover, during the XOR logical operation, the XOR logic operation is performed on each set of the corresponding elements in the first array ARR1 and the second array ARR2. In detail, when the XOR logic operation is preformed, the controller 160 first performs the XOR logic operation on the bits in the element EL0 of the first array ARR1 and the bits in the element EL0 of the second array ARR2 to obtain a first result, then, performs the XOR logic operation on the bits in the element EL1 of the first array ARR1 and the bits in the element EL1 of the second array ARR2 to obtain a second result, and then performs the XOR logic operation on the bits in the element EL2 of the first array ARR1 and the bits in the element EL2 of the second array ARR2 to obtain a third result. Finally, the controller 160 fills the bits of the first result, the second result, and the third into the elements EL0-EL2 of the third array sequentially. As shown in FIG. 5, the preset mode parameters are the same as the mode parameters shown in FIG. 2, and the mode parameters of one byte are filled into one element.

Next, in step S306, the controller 160 performs an AND logic operation on the third array and a fourth array and fills the result of the AND logic operation into a fifth array. The AND logic operation is performed on each set of the corresponding elements in the third array and the fourth array, and the values of the fourth array represent which bit of the preset mode page setting cannot be rewritten. In detail, during the AND logic operation, the controller 160 performs the AND logic operation on the bits of the element EL0 in the third array and the bits in the element EL0 of the fourth array to obtain a first result, then, performs the AND logic operation on the bits in the element EL1 of the third array and the bits in the element EL1 of the fourth array to obtain a second result, and then performs the AND logic operation on the bits in the element EL2 of the third array and the bits in the element EL2 of the fourth array to obtain a third result. Finally, the controller 160 fills the bits of the first result, the second result, and the third into the elements EL0-EL2 of the fifth array sequentially. For example, each element of the fourth array corresponds to one row of the preset mode page setting (i.e., 1 byte). If one bit in an element of the fourth array is set to "1", the parameter corresponding to the bit which is set to "1" is a parameter that cannot be rewritten in the preset page mode setting (that is, a non-rewritable mode parameter). If one bit in an element of the fourth array is set to "0", the parameter corresponding to the bit which is set to "0" is a parameter that can be rewritten in the preset page mode setting (i.e., a rewritable mode parameter). Finally, in step S308, the controller 160 may determine whether the data out message (data out UPIU) comprises a new mode page setting which will rewrite non-rewritable mode parameters according to the results of the fifth array. In detail, if any element of the fifth array comprises any non-zero bit (i.e., the bit value is 1), a new mode parameter corresponding to the non-zero bit will change the non-writable mode parameter of the preset mode page setting. Therefore, when any element of the fifth array comprises a non-zero bit, the process proceeds to step S312; otherwise, the process proceeds to step S310. In step S312, the controller 160 rejects the mode selection command and replies "failure" to the host 120. In step S310, the controller 160 accepts the mode selection command, rewrites the preset mode page setting, and replies "success" to the host 120.

For example, the controller 160 obtains new mode parameters from the data output message, wherein the new mode parameters comprise a new first mode parameter with a bit value "1" (A0'), a new second mode parameter with a bit value "0" (B0'), a new third mode parameter with a bit value "001011" (C0'-C5'), a new fourth mode parameter with a bit value "00110001" (D0'-D7'), a new fifth mode parameter with a bit value "1101" (E0'-E3'), a new sixth mode parameter with a bit value "0" (F0'), a new seventh mode parameter with a bit value "00" (G0'-G1'), and a new eighth mode parameter with a bit value of "1" (H0'). Next, the controller 160 fills the obtained new mode parameters into the elements of the first array ARR1 comprising. The first element EL0 of the first array ARR1 filled with the new mode parameters is "10001011" (A0', B0', C0'-C5'), the second element EL1 the first array ARR1 filled with the new mode parameter is "00110001" (D0'-D7'), and the third element EL2 the first array ARR1 filled with the new mode parameters is "11010001" (E0'-E3', F0', G0'-G1', H0'). Moreover, the first element EL0 of the second array ARR2 filled with the preset mode parameters is "11001011" (A0, B0, C0-C5), the second element EL1 the second array ARR2 filled with the preset mode parameter is "00110111" (D0-D7), and the third element EL2 the second array ARR2 filled with the preset mode parameters is "11010001" (E0-E3, F0, G0-G1, H0). Next, the controller 160 performs the XOR logic operation on the bits "10001011" in the element EL0 of the first array ARR1 and the bits "11001011" in the element EL0 of the second array ARR2 to obtain the first result "01000000", then, performs the XOR logic operation on the bits "00110001" in the element EL1 of the first array ARR1 and the bits "00110111" in the element EL1 of the second array ARR2 to obtain the second result "00000110", and then performs the XOR logic operation on the bits "11010001" in the element EL2 of the first array ARR1 and the bits "11010001" in the element EL2 of the second array ARR2 to obtain the third result "00000000". Finally, the control 160 fills the bits of the first result, the second result, and the third into the elements EL0-EL2 of the third array sequentially. From the obtained results, it is seen that the bit values in the elements EL0 corresponding to B0 and B0' have changed, and the bit values in the elements EL1 corresponding to D5-D6 and D5'-D6' have changed. In other words, the new second mode parameter and the new fourth mode parameter are different from the preset second mode parameter and the fourth mode parameter respectively. Then, the controller 160 can determine whether the changed new second mode parameter and the changed new fourth mode parameter are non-changeable parameters through using the fourth array and the AND logic operation.

In the embodiment, it is assumed that only the second mode parameter (B0) and the fifth mode parameter (E0-E3) among the mode parameters can be rewritten. Thus, in the fourth array, the bits in the element EL0 of the fourth array are set to "10111111"; the bits in element EL1 are set to "11111111", and the bits in element EL2 are set to "00001111". The results which are obtained by performing the AND logic operation on the three elements of the third array and the three elements of the fourth array are "00000000", "00000110" and "00000000" respectively, wherein the results are sequentially filled into the elements EL0-EL2 of the fifth array. From the results of the fifth array, it is seen that the bit values in the element EL1 corresponding to D5 and D6 are non-zero. Therefore, the controller 160 knows that the original fourth mode parameter that cannot be changed is rewritten by the new fourth mode parameter. Therefore, in the present embodiment, the controller 160 rejects the mode selection command and replies "failure" to the host 120.

In another embodiment, it is assumed that only the second mode parameter (B0) and the fourth mode parameter (D0-D7) among the mode parameters can be rewritten. Thus, in the fourth array, the bits in the element EL0 are set to "10111111", the bits in the element EL1 are set to "00000000", and the bits in the element EL2 are set to "11111111". The results which are obtained by performing the AND logic operation on the three elements of the third array and the three elements of the fourth array of logical AND operation of the three elements in the third array and the fourth array are respectively "00000000", "00000000" and "00000000", wherein the results are sequentially filled into the elements EL0-EL2 of the fifth array. From the results of the fifth array, all the bit values are zero. Therefore, in the present embodiment, the controller 160 accepts the mode selection command, rewrites the preset mode page setting, and replies "success" to the host 120.

In an embodiment, the controller 160 may reply to the host 120 of the success event or the failure event by using a UPIU response message (response UPIU). The UPIU response message comprises a response field, a status field, a sense data [2] field, and a sense data [12]-[13] field. For example, when the controller 160 replies to the host 120 of the failure event, the response field, the status field, the sense data [2] field, and the sense data [12]-[13] field are set as "TARGET FAILURE", "CHECK CONDITION", "ILLEGAL REQUEST", and "INVALID FIELD IN PARAMETER LIST", respectively.

As shown in the above embodiments, the data storage device 100 may reject the request for non-rewritable mode parameters to be changed and notify the host 120 that the request has been rejected. In addition, the controller 160 may determine whether the non-rewriteable mode parameters will be changed through using an array and a logic operation. Therefore, embodiments of the present invention can prevent the data storage device 140 from operating in an improper environment and thereby improve performance by determining whether the non-rewritable mode parameters will be changed or not.

The methods, or certain aspects or portions thereof, may take the form of a program code embodied in tangible media, such as floppy diskettes, CD-ROMs, hard drives, or any other machine-readable (e.g., computer-readable) storage medium, or computer program products without limitation in external shape or form thereof, wherein, when the program code is loaded into and executed by a machine, such as a computer, the machine thereby becomes an apparatus for practicing the methods. The methods may also be embodied in the form of a program code transmitted over some transmission medium, such as an electrical wire or a cable, or through fiber optics, or via any other form of transmission, wherein, when the program code is received and loaded into and executed by a machine, such as a computer, the machine becomes an apparatus for practicing the disclosed methods. When implemented on a general-purpose processor, the program code combines with the processor to provide a unique apparatus that operates analogously to application specific logic circuits.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device comprising:
a flash memory storing a firmware, wherein the firmware comprises a plurality of mode page settings, and each mode page setting comprises a plurality of mode parameters; and
a controller receiving a data out message from a host, wherein the data out message is arranged to rewrite a first mode page setting among the plurality of mode page settings, and further determining whether the data out message will change mode parameters which cannot be rewritten in the first mode page setting by performing bitwise logic operations on a new mode page setting in the data out message, preset values of the plurality of mode parameters of the first mode page setting, and a rewriteable setting for each bit of the first mode page setting,
wherein in response to any one of bits of a result of the bitwise logic operations being a non-zero value, the controller determines that the data out message will change the mode parameters which cannot be rewritten in the first mode page setting.

2. The data storage device as claimed in claim 1, wherein in response to the controller determining that the data out message will change the mode parameters which cannot be rewritten in the first mode page setting, the controller replies to the host with a UPIU (universal flash storage Protocol Information Units) response message indicating a failure event,
wherein the UPIU response message comprises a response field, a status field, a first sense data field, and a second sense data field, and
wherein in the UPIU response message corresponding to the failure event, the response field is set as "TARGET FAILURE", the status field is set as "CHECK CONDITION", the first sense data field is set as "ILLEGAL REQUEST", and the second sense data field is set as "INVALID FIELD IN PARAMETER LIST".

3. The data storage device as claimed in claim 1, wherein in response to the controller determining that the data out message will not change the mode parameters which cannot be rewritten in the first mode page setting, the controller further replies to the host with the UPIU response message indicating a success event,
wherein the UPIU response message comprises a response field and a status field, and
wherein in the UPIU response message corresponding to the success event, the response field is set as "TARGET SUCCESS", the status field is set as "GOOD".

4. The data storage device as claimed in claim 1, wherein the data out message comprises a header and the new mode page setting, and
wherein the new mode page setting corresponds to the first mode page setting and comprises a plurality of new mode parameters corresponding to the plurality of mode parameters of the first mode page setting.

5. The data storage device as claimed in claim 4, wherein after the controller sends a ready-to-transfer message to the host in response to a mode selection command from the host, the controller receives the data out message which is sent by the host in response to the ready-to-transfer message.

6. The data storage device as claimed in claim 5, wherein the mode selection command comprises a save page parameter which is used to indicate whether the plurality of new mode parameters are kept after the data storage device is turned off.

7. The data storage device as claimed in claim 6, wherein the controller determines that the plurality of new mode parameters are not kept in the flash memory after the data storage device is turned off when the save page parameter is "0", and determines that the plurality of new mode parameters are kept in the flash memory after the data storage device is turned off when the save page parameter is "1".

8. The data storage device as claimed in claim 4, wherein the controller fills the plurality of new mode parameters into a first array, fills preset values of the plurality of mode parameters of the first mode page setting into a second array, performs a bitwise XOR logic operation on the first array and the second array to obtain a first result,
   wherein the controller fills the first result into a third array.
9. The data storage device as claimed in claim 8,
   wherein the controller performs a bitwise AND logic operation on the third array and a fourth array and fills a second result of the bitwise AND logic operation into a fifth array,
   wherein in the fourth array, bits corresponding to the mode parameters which cannot be rewritten are "1", and bits corresponding to mode parameters which can be rewritten are "0", and
   wherein when any one of bits in the fifth array is a non-zero integer, the controller determines that the data out message will change the mode parameters which cannot be rewritten in the first mode page setting.
10. A method for rewriting parameters applied in a data storage device which comprises a flash memory storing a firmware, the firmware comprising a plurality of mode page settings, each mode page setting comprising a plurality of mode parameters, and the method for rewriting parameters comprising:
   receiving a data out message from a host, wherein the data out message is arranged to rewrite a first mode page setting among the plurality of mode page settings;
   determining whether the data out message will change mode parameters which cannot be rewritten in the first mode page setting by performing bitwise logic operations on a new mode page setting in the data out message, preset values of the plurality of mode parameters of the first mode page setting, and a rewriteable setting for each bit of the first mode page setting; and
   in response to any one of bits of a result of the bitwise logic operations being a non-zero value, determining that the data out message will change the mode parameters which cannot be rewritten in the first mode page setting.
11. The method for rewriting parameters as claimed in claim 10, further comprising:
   when it is determined that the data out message will change the mode parameters which cannot be rewritten in the first mode page setting, replying to the host with a UPIU (universal flash storage Protocol Information Units) response message indicating a failure event,
   wherein the UPIU response message comprises a response field, a status field, a first sense data field, and a second sense data field, and
   wherein in the UPIU response message corresponding to the failure event, the response field is set as "TARGET FAILURE", the status field is set as "CHECK CONDITION", the first sense data field is set as "ILLEGAL REQUEST", and the second sense data field is set as "INVALID FIELD IN PARAMETER LIST".
12. The method for rewriting parameters as claimed in claim 10, further comprising:
   when it the data out message will not change the mode parameters which cannot be rewritten in the first mode page setting, replying to the host with the UPIU response message indicating a success event,
   wherein the UPIU response message comprises a response field and a status field, and
   wherein in the UPIU response message corresponding to the success event, the response field is set as "TARGET SUCCESS", the status field is set as "GOOD".
13. The method for rewriting parameters as claimed in claim 10,
   wherein the data out message comprises a header and the new mode page setting, and
   wherein the new mode page setting corresponds to the first mode page setting and comprises a plurality of new mode parameters corresponding to the plurality of mode parameters of the first mode page setting.
14. The method for rewriting parameters as claimed in claim 13 further comprising:
   sending a ready-to-transfer message to the host in response to a mode selection command from the host, wherein the data out message is sent by the host in response to the ready-to-transfer message.
15. The method for rewriting parameters as claimed in claim 14, wherein the mode selection command comprises a save page parameter which is used to indicate whether the plurality of new mode parameters are kept after the data storage device is turned off.
16. The method for rewriting parameters as claimed in claim 15, wherein,
   when the save page parameter is "0", determining that the plurality of new mode parameters are not kept in the flash memory after the data storage device is turned off; and
   when the save page parameter is "1", determining that the plurality of new mode parameters are kept in the flash memory after the data storage device is turned off.
17. The method for rewriting parameters as claimed in claim 13, wherein the step of determining whether the data out message will change the mode parameters which cannot be rewritten in the first mode page setting according to the data out message comprises:
   filling the plurality of new mode parameters into a first array;
   filling preset values of the plurality of mode parameters of the first mode page setting into a second array;
   performing a bitwise XOR logic operation on the first array and the second array to obtain a first result; and
   filling the first result into a third array.
18. The method for rewriting parameters as claimed in claim 17, wherein the step of performing the bitwise logic operations further comprises:
   performing a bitwise AND logic operation on the third array and a fourth array;
   filling a second result of the bitwise AND logic operation into a fifth array,
   wherein in the fourth array, bits corresponding to the mode parameters which cannot be rewritten are "1", and bits corresponding to mode parameters which can be rewritten are "0",
   when any one of bits in the fifth array is a non-zero integer, determining that the data out message will change the mode parameters which cannot be rewritten in the first mode page setting; and
   when none of the bits in the fifth array is a non-zero integer, determining that the data out message will not change the mode parameters which cannot be rewritten in the first mode page setting.

* * * * *